United States Patent
Jung et al.

(10) Patent No.: US 9,806,213 B2
(45) Date of Patent: Oct. 31, 2017

(54) ENCAPSULANT FOR PV MODULE, METHOD OF MANUFACTURING THE SAME AND PV MODULE COMPRISING THE SAME

(71) Applicant: LG CHEM, LTD., Seoul (KR)

(72) Inventors: Je Sik Jung, Daejeon (KR); Hyun Cheol Kim, Daejeon (KR); Jung Youn Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/107,075

(22) PCT Filed: Feb. 26, 2015

(86) PCT No.: PCT/KR2015/001873
§ 371 (c)(1),
(2) Date: Jun. 21, 2016

(87) PCT Pub. No.: WO2015/130101
PCT Pub. Date: Sep. 3, 2015

(65) Prior Publication Data
US 2016/0336469 A1 Nov. 17, 2016

(30) Foreign Application Priority Data
Feb. 26, 2014 (KR) ........................ 10-2014-0022842

(51) Int. Cl.
| | | |
|---|---|---|
| *C08F 212/10* | (2006.01) | |
| *H01L 31/048* | (2014.01) | |
| *H01L 31/049* | (2014.01) | |
| *C08F 255/08* | (2006.01) | |
| *C08J 5/18* | (2006.01) | |
| *C08L 23/20* | (2006.01) | |
| *C09J 123/20* | (2006.01) | |
| *C09J 123/08* | (2006.01) | |
| *C08L 23/08* | (2006.01) | |
| *C08F 255/02* | (2006.01) | |

(52) U.S. Cl.
CPC ........ *H01L 31/0481* (2013.01); *C08F 255/02* (2013.01); *C08F 255/08* (2013.01); *C08J 5/18* (2013.01); *C08L 23/0815* (2013.01); *C08L 23/20* (2013.01); *C09J 123/0815* (2013.01); *C09J 123/20* (2013.01); *H01L 31/049* (2014.12); *C08F 2500/11* (2013.01); *C08F 2500/12* (2013.01); *C08F 2500/26* (2013.01); *C08F 2810/30* (2013.01); *C08F 2810/40* (2013.01); *C08J 2323/20* (2013.01); *C08J 2423/06* (2013.01); *C08J 2451/06* (2013.01); *C08L 2203/162* (2013.01); *C08L 2203/204* (2013.01); *C08L 2205/025* (2013.01); *C08L 2205/03* (2013.01); *C08L 2207/066* (2013.01); *C08L 2310/00* (2013.01); *C09J 2203/322* (2013.01); *C09J 2205/114* (2013.01)

(58) Field of Classification Search
CPC ................ C09J 123/0815; C09J 123/20; C09J 2203/322; C09J 2205/114; C08L 23/0815; C08L 23/20; C08L 51/06; C08L 23/06; C08L 2207/066; C08L 2310/00; C08L 2205/03; C08L 2205/025; C08L 2203/204; C08L 2203/162; C08F 255/02; C08F 255/08; C08F 230/08; C08F 2810/40; C08F 2810/30; C08F 2500/26; C08F 2500/12; C08F 2500/11; H01L 31/0481; H01L 31/049
See application file for complete search history.

(56) References Cited

U.S. PATENT DOCUMENTS

| | | |
|---|---|---|
| 9,212,248 B2 | 12/2015 | Chae et al. |
| 9,570,642 B2 | 2/2017 | Matsui et al. |
| 2013/0255756 A1 | 10/2013 | Seo et al. |
| 2014/0069497 A1 | 3/2014 | Hwang et al. |
| 2014/0221559 A1* | 8/2014 | Weeks ................ C08L 23/0815 524/528 |
| 2015/0013753 A1* | 1/2015 | Nanjundiah et al. ................. B32B 17/10018 136/251 |
| 2015/0376479 A1* | 12/2015 | Kim et al. .............. H01L 23/29 136/259 |

FOREIGN PATENT DOCUMENTS

| | | |
|---|---|---|
| CN | 101248099 A | 8/2008 |
| CN | 102217091 A | 10/2011 |
| CN | 103228721 A | 7/2013 |
| JP | 2007-103738 A | 4/2007 |
| JP | 2009-512753 A | 3/2009 |
| JP | 2009-302220 A | 12/2009 |
| JP | 2012-009754 A | 1/2012 |
| JP | 2012-097198 A | 5/2012 |
| JP | 2012-216805 A | 11/2012 |
| JP | 5072211 B2 | 11/2012 |
| JP | 2013-165263 A | 8/2013 |
| KR | 10-2010-0123505 A | 11/2010 |
| KR | 10-2012-0078026 A | 7/2012 |
| KR | 10-1314496 B1 | 10/2013 |
| WO | 2012/144838 A2 | 10/2012 |
| WO | 2012/157962 A2 | 11/2012 |
| WO | 2013/084850 A1 | 6/2013 |

* cited by examiner

*Primary Examiner* — Nathan M Nutter
(74) *Attorney, Agent, or Firm* — Dentons US LLP

(57) ABSTRACT

The present application relates to an encapsulant for a PV module, a method of manufacturing the same and a PV module. The encapsulant according to an embodiment of the present application has excellent heat resistance or the like and improved creep physical properties, and thus even when the encapsulant is used under conditions of a high temperature and/or high humidity for a long time, deformation is small and the encapsulant can exhibit excellent adhesive strength. Accordingly, when the encapsulant is applied to a PV module, durability or the like may be improved.

15 Claims, 2 Drawing Sheets

[FIG 1]
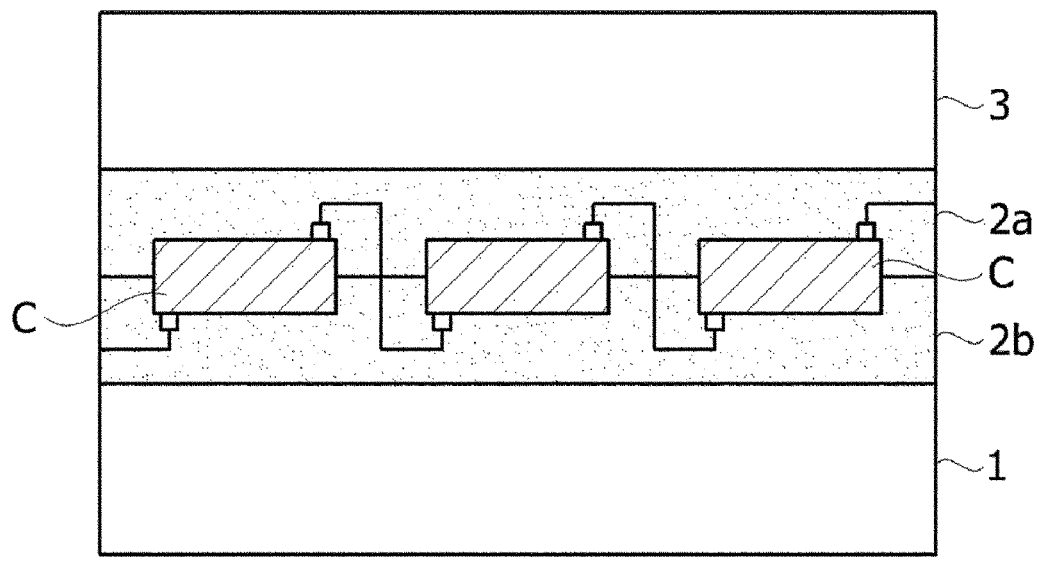
[FIG 2]
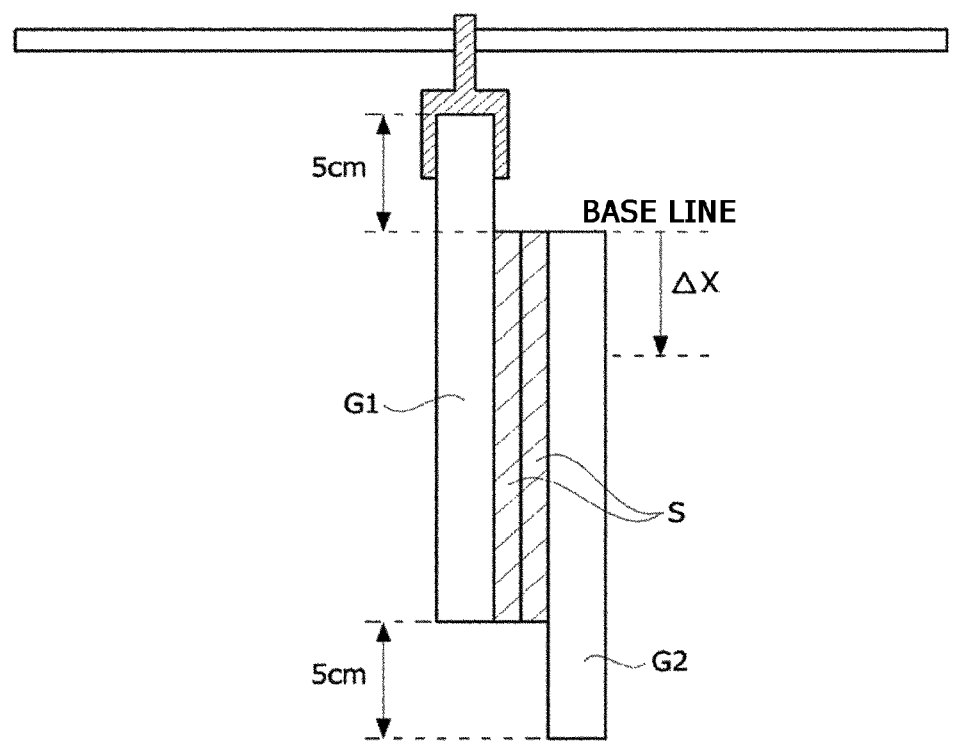

[FIG 3]
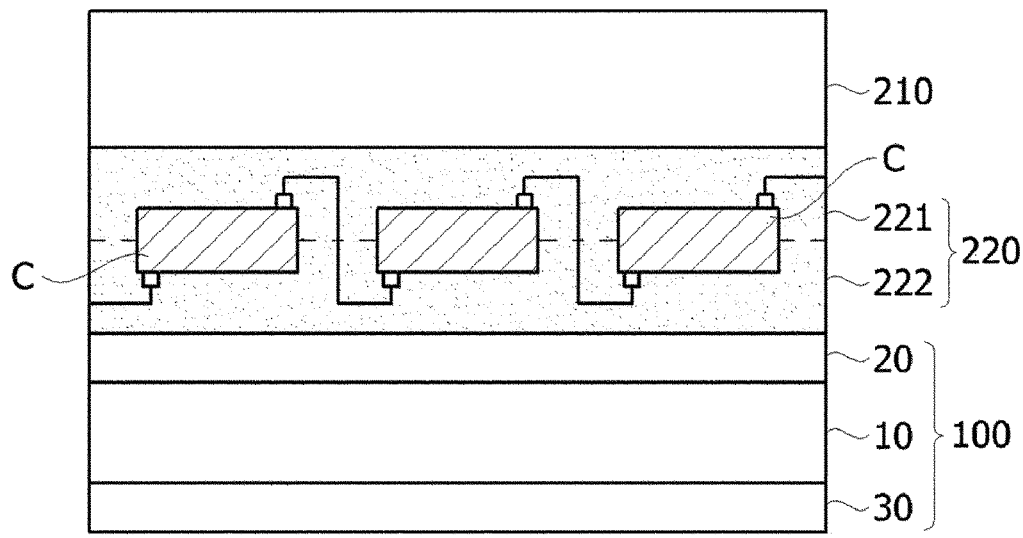
[FIG 4]
EXAMPLE 1      COMPARATIVE EXAMPLE 1
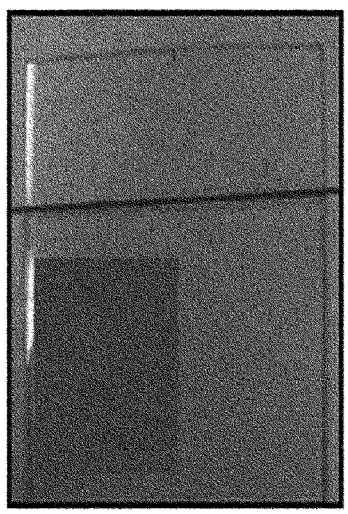 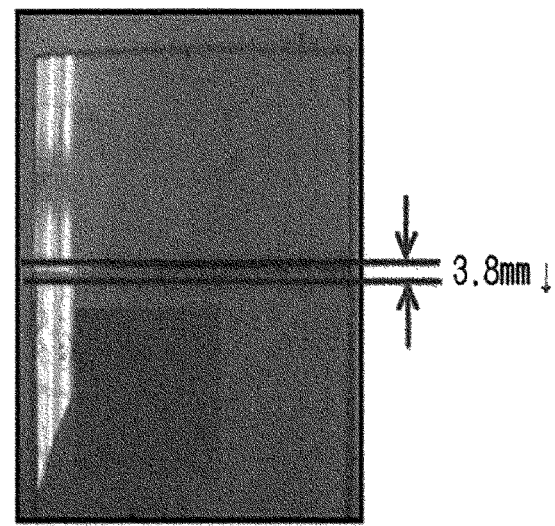

ENCAPSULANT FOR PV MODULE, METHOD OF MANUFACTURING THE SAME AND PV MODULE COMPRISING THE SAME

This application is a National Stage Application of International Application No. PCT/KR2015/001873 filed on Feb. 26, 2015, which claims the benefit of Korean Patent Application No. 10-2014-0022842 filed on Feb. 26, 2014, all of which are hereby incorporated by reference in their entirety for all purposes as if fully set forth herein.

TECHNICAL FIELD

The present application relates to an encapsulant for a PV module, a method of manufacturing the same and a PV module.

BACKGROUND ART

Recently, much attention has been paid to new and renewable energy or clean energy due to the problems of contamination of the environment and exhaustion of fossil fuels. Among them, energy using light is being spotlighted as a representative clean energy source capable of resolving the problems of contamination of the environment and exhaustion of fossil fuels. As representative energy using light, for example, there are photovoltaic cells such as solar cells, etc.

The photovoltaic cells are devices converting sunlight to electric energy, which are generally required to be exposed to external circumstances for a long time so as to easily absorb sunlight, and thus various types of packages are used to protect an internal device and the photovoltaic cells are manufactured in a unit form, which is typically referred to as a "PV module".

Usually, the PV module includes a back sheet to protect the internal device (for example, a solar cell). FIG. 1 is a view illustrating a cross section of a solar cell module as a conventional PV module.

Referring to FIG. 1, the solar cell module usually has a structure in which transparent tempered glass 3 to which light is incident, a front encapsulant layer 2a, a plurality of solar cells C, a back encapsulant layer 2b, and a back sheet 1 are sequentially stacked. Further, the plurality of solar cells C are electrically connected to each other, and packed and fixed by the front and back encapsulant layers 2a and 2b.

As an encapsulant forming the front and back encapsulant layers 2a and 2b, an ethylene vinyl acetate (EVA) copolymer is usually used. Since the ethylene vinyl acetate copolymer is advantageous in formability, a manufacturing cost, and physical properties such as transparency or the like, it has been widely used in the past.

However, the ethylene vinyl acetate copolymer has low moisture barrier properties, and thus resulting in low adhesive strength with the solar cell C or the transparent tempered glass 3 under conditions of a high temperature and high humidity, and the generation of delamination between the layers upon the long term use. Further, the ethylene vinyl acetate copolymer causes the corrosion of electrodes by generating a hydrolysis reaction due to the penetration of moisture, and also brings about the problems of air bubbles, etc. These problems eventually decrease efficiency when the encapsulants are applied to the solar cell module.

To address these problems, techniques using an ethylene/α(alpha)-olefin-based copolymer for the encapsulant are being attempted. Techniques related thereto are disclosed in Patent documents 1 and 2. The ethylene/α-olefin-based copolymer has moisture permeability lower than the ethylene vinyl acetate copolymer, does not generate hydrolysis reaction products such as acetic acid or the like, and thus can increase reliability of the solar cell module.

However, an encapsulant formed of the material of the ethylene/α(alpha)-olefin-based copolymer has low adhesion or the like, the problem of delamination attributable to low heat resistance due to a low melting point (Tm) in the solar cell module upon the long term use is still present, accordingly, the decrease in power output from the solar cell module is generated upon being applied to the PV module, and thus a solution is required.

DISCLOSURE

Patent Document (Patent document 1) Korean Patent Laid-Open Publication No. 10-2012-0078026
(Patent document 2) Japanese Patent Laid-open Publication No. 2009-302220

DETAILED DESCRIPTION OF THE INVENTION

Technical Problem

The present application provides an encapsulant for a PV module, a method of manufacturing the same and a PV module.

More specifically, the present application is directed to providing an encapsulant for a PV module which exhibits improved adhesion, and particularly, which can prevent delamination attributable to low heat resistance due to a low melting point (Tm) in the solar cell module upon the long term use, a method of manufacturing the same and a PV module.

Technical Solution

An exemplary encapsulant according to an embodiment of the present application relates to an encapsulant for a PV module (hereinafter, may be referred to as an "encapsulant").

In the embodiment, the encapsulant may include, 1) an ethylene/α(alpha)-olefin-based copolymer, 2) a silane modified ethylene/α-olefin-based copolymer, and 3) a heat resistant polymer resin.

Hereinafter, the components will be described in detail.

1) Ethylene/α-Olefin-Based Copolymer

As the ethylene/α-olefin-based copolymer according to the embodiment of the present application, any copolymer which is prepared by polymerizing ethylene and α-olefins may be used without particular limitation.

In the present specification, an "ethylene/α-olefin-based copolymer" may denote a concept covering all copolymers including ethylene at 50 mol % or more as a polymerization unit in addition to a homopolymer of ethylene, and further including an olefin monomer having three or more carbon atoms or other comonomers as a polymerization unit.

For example, α-olefin forming the ethylene/α-olefin copolymer may include one or more types selected from the group consisting of α(alpha)-olefins such as ethylene, propylene, isobutylene, 1-butene, 1-pentene, 1-hexene, 1-heptene, 1-octene, 1-nonene, 1-decene, 4-phenyl-1-butene, 6-phenyl-1-hexene, 2-methyl-1-butene, 3-methyl-1-butene, 4-methyl-1-butene, 3-methyl-1-pentene, 4-methyl-1-hexene, 5-methyl-1-hexene, 3,3-dimethyl-1-pentene, 3,4-dimethyl-1-pentene, 4,4-dimethyl-1-pentene, vinyl cyclohexane, or the like; and halogen-substituted α-olefins hexafluoropropene, tetrafluoroethylene, 2-fluoropropene, fluoroethylene, 1,1-difluoroethylene, 3-fluoropropene, trifluoroethylene, 3,4-dichloro-1-butene, etc.

The ethylene/α-olefin-based copolymer may be a polymer in various shapes, even when the copolymer is prepared from the same types of the monomer(s). The ethylene/α-olefin-based copolymer may include, for example, a random copolymer, a block copolymer or a graft copolymer polymerized by adjusting the different segments.

In the embodiment, the ethylene/α-olefin-based copolymer may be one or more types selected from the group consisting of a low-density ethylene/α-olefin-based copolymer, a medium-density ethylene/α-olefin-based copolymer, a high-density ethylene/α-olefin-based copolymer, an ultra-low-density ethylene/α-olefin-based copolymer, a super ultra-low-density ethylene/α-olefin-based copolymer, a linear low-density ethylene/α-olefin-based copolymer, etc.

The density of the ethylene/α-olefin-based copolymer may be in the range of about 0.82 to 0.96 g/cm$^3$, or about 0.85 to 0.92 g/cm$^3$, but is not limited thereto.

Further, the melt index (MI) of the ethylene/α-olefin copolymer may be in the range of about 1.0 g/10 min to 50.0 g/10 min, about 1.0 g/10 min to 30.0 g/10 min, about 1.0 g/10 min to 10.0 g/10 min, about 1.0 g/10 min to 8.0 g/10 min or about 3.0 g/10 min to 7.0 g/10 min at a temperature of about 190° C. and a load of 2.16 kg. When the melt index (MI) of the ethylene/α-olefin copolymer is adjusted in the above-described range, an encapsulant prepared therefrom may exhibit excellent formability, etc.

2) Silane Modified Ethylene/α-Olefin-Based Copolymer

The silane modified ethylene/α-olefin-based copolymer according to the embodiment of the present application may be a silane modified copolymer of an ethylene/α-olefin-based copolymer.

In the present specification, a "silane modified ethylene/α-olefin-based copolymer" may denote a copolymer prepared by polymerizing an ethylene/α-olefin-based copolymer and a silane compound. Further, the polymerization may be, but is not particularly limited to, for example, a graft polymerization.

An encapsulant according to the embodiment of the present application may ensure physical properties such as adhesive strength, sealing properties, or the like by including the silane modified ethylene/α-olefin-based copolymer therein.

The silane modified ethylene/α-olefin-based copolymer may include a silane compound at about 0.001 to 20 parts by weight, about 0.01 to 15 parts by weight or about 0.1 to 10 parts by weight with respect to 100 parts by weight of an ethylene/α-olefin-based copolymer. When the content of the silane compound is less than 0.001 parts by weight, the improvement effect of adhesive strength, sealing properties, or the like achieved therefrom may be small. When a content of the silane compound is more than 20 parts by weight, the synergistic effect according to the overuse is not so great, but rather viscosity may be increased, and thus formability may be decreased.

As the silane compound, any compound having a silane group in its molecules may be used without particular limitation. For example, the silane compound may include an unsaturated silane compound and/or an amino silane compound.

In the embodiment, the silane compound may be selected from compounds represented by the following Formula 1.

$$DSiR^1_pR^2_{(3-p)}$$ [Formula 1]

In Formula 1 D is an alkenyl group, $R^1$ is an alkoxy group, an alkylthio group, an aryloxy group, an acyloxy group, a hydroxy group, a halogen group, an amine group or —$R^3R^4$, $R^3$ is an oxygen (O) or sulfur (S) atom, $R^4$ is an alkyl group, an aryl group, or an acyl group, $R^2$ is hydrogen, an alkyl group, an aryl group, or an aralkyl group, and p is an integer in a range of 1 to 3.

In the present specification, the term "alkenyl group" may denote a hydrocarbon compound, which is bound to silicon atoms, and has at least one unsaturated group (e.g., a functional group having double bonds) in its molecules. Further, the carbon atoms of the alkenyl group may number, for example, in the range of 2 to 20, 2 to 12, or 2 to 6. For example, the alkenyl group may include a vinyl group, an allyl group, a propenyl group, an isopropenyl group, a butenyl group, a hexenyl group, a cyclohexenyl group, a γ-methacryloxypropyl group, or the like, and may be preferably a vinyl group, but is not limited thereto.

In Formula 1, $R^1$ is bound to silicon atoms, and selected from an alkoxy group, an alkylthio group, an aryloxy group, an acyloxy group, a hydroxy group, a halogen group, an amine group, or —$R^3R^4$. Here, $R^3$ is an oxygen (O) or sulfur (S) atom, and $R^4$ is selected from an alkyl group, an aryl group, or an acyl group.

In Formula 1, $R^2$ is bound to silicon atoms, and selected from hydrogen, an alkyl group, an aryl group, or an aralkyl group. Further, in Formula 1, p is an integer in the range of 1 to 3, and may be preferably 3, but is not limited thereto.

In the present specification, the term "alkoxy group" may denote, for example, an alkoxy group having 1 to 20 carbon atoms, 1 to 12 carbon atoms, 1 to 8 carbon atoms or 1 to 4 carbon atoms. The alkoxy group may be, for example, selected from a methoxy group, an ethoxy group, a propoxy group, an isopropoxy group, a butoxy group or the like, and may be preferably a methoxy group or an ethoxy group, but is not limited thereto.

Further, the acyloxyl group may be an acyloxyl group having 1 to 12 carbon atoms, the alkylthio group may be an alkylthio group 1 to 12 carbon atoms.

In the present specification the term "alkyl group" may have, for example, 1 to 12 carbon atoms, 1 to 8 carbon atoms or 1 to 4 carbon atoms, and for example, may be selected from a methyl group, an ethyl group, a propyl group, etc. The aryl group may have, for example, 6 to 18 carbon atoms, or 6 to 12 carbon atoms, and for example, may be a phenyl group. Further, the aralkyl group may be, for example, an aralkyl group having 7 to 19 carbon atoms, or 7 to 13 carbon atoms, and for example, may be a benzyl group, but is not limited thereto.

In the embodiment, the silane compound may be selected from vinylalkoxy silanes having one or more vinyl groups in their molecules. The vinylalkoxy silane may be, for example, one or more types selected from the group consisting of vinyltrimethoxy silane, vinyltriethoxy silane, vinyltripropoxy silane, vinyltriisopropoxy silane, vinyltributoxy silane, vinyltripentoxy silane, vinyltriphenoxy silane and vinyltriacetoxy silane.

In the embodiment, the silane compound may include a compound represented by the following Formula 2.

$$SiR^5_qR^6_{(4-q)}$$ [Formula 2]

In Formula 2, $R^5$ is —$(CH_2)_vNR^7R^8$, $R^7$ and $R^8$ are each independently hydrogen or $R^9NH_2$ bound to nitrogen atoms, $R^9$ is an alkylene group having 1 to 6 carbon atoms, $R^6$ is halogen, an amine group, —$R^{10}R^{11}$ or —$R^{11}$, $R^{10}$ is an oxygen (O) or sulfur (S) atom, $R^{11}$ is hydrogen, an alkyl group, an aryl group, an aralkyl group, or an acyl group, and q is an integer in the range of 1 to 4.

The amine group may be a primary amine and/or secondary amine

In Formula 2, the alkyl group, aryl group, aralkyl group and acyl group is the same as described in Formula 1.

In the embodiment, the silane compound may be an aminoalkoxy silane.

For example, the amino silane compound may be one or more types selected from the group consisting of aminopropyltrimethoxy silane, aminopropyltriethoxy silane, bis[3-triethoxysilyl)propyl]amine, bis[3-trimethoxysilyl)propyl] amine, aminopropylmethyldiethoxy silane, aminopropylmethyldimethoxy silane, N-[3-(trimethoxysilyl)propyl]ethylenediamine, aminoethylaminopropyltriethoxy silane, aminoethylaminopropylmethyldimethoxy silane, aminoethylaminopropylmethyldiethoxy silane, aminoethylaminomethyltriethoxy silane, aminoethylaminomethylmethyldiethoxy silane, diethylenetriaminopropyltrimethoxy silane, diethylenetriaminopropyltriethoxy silane, diethylenetriaminopropylmethyldimethoxy silane, diethyleneaminomethylmethyldiethoxy silane, (N-phenylamino)methyltrimethoxy silane, (N-phenylamino)methyltriethoxy silane, (N-phenylamino)methylmethyldimethoxy silane, (N-phenylamino)methylmethyldiethoxy silane, 3-(N-phenylamino)propyltrimethoxy silane, 3-(N-phenylamino)propyltriethoxy silane, 3-(N-phenylamino)propylmethyldimethoxy silane, 3-(N-phenylamino)propylmethyldiethoxy silane, N—(N-butyl)-3-aminopropyltrimethoxy silane, glycidoxypropyl trimethoxy silane, and glycidoxypropyl triethoxy silane.

In the embodiment, the silane modified ethylene/α-olefin-based copolymer may include both above-described unsaturated silane compound and amino silane compound as the silane compound. Here, the unsaturated silane compound and amino silane compound, for example, may be mixed in the weight ratio of 100:0.5 to 30 and be included. When the silane modified ethylene/α-olefin-based copolymer includes both the unsaturated silane compound and amino silane compound, an encapsulant prepared therefrom may ensure further excellent adhesive physical properties as compared to the case in which only one of the two materials is included.

The silane modified ethylene/α-olefin-based copolymer may be prepared by polymerizing a resin composition including a radical initiator instead of polymerizing the above-described ethylene/α-olefin-based copolymer and silane compound.

As the radical initiator, any radical initiator through which the graft polymerization of the silane compound and the ethylene/α-olefin-based copolymer is initiated may be used without particular limitation. The radical initiator, for example, may be selected from compounds which may initiate the radical polymerization of a vinyl group, and as a specific example, may be one or more types selected from the group consisting of organic peroxides, hydro peroxides, azo compounds, etc. More specifically, examples of the radical initiator may include one or more types selected from the group consisting of dialkyl peroxides such as t-butyl-cumyl peroxide, di-t-butyl peroxide, di-cumyl peroxide, 2,5-dimethyl-2,5-di(t-butylperoxy)hexane, 2,5-dimethyl-2,5-di(t-butylperoxy)-3-hexyne, and the like; hydroperoxides such as cumen hydroperoxide, diisopropyl benzene hydroperoxide, 2,5-dimethyl-2,5-di(hydroperoxy)hexane, t-butyl hydroperoxide, and the like; diacyl peroxides such as bis-3,5,5-trimethylhexanoyl peroxide, octanoyl peroxide, benzoyl peroxide, o-methylbenzoyl peroxide, 2,4-dichlorobenzoyl peroxide, and the like; peroxy esters such as t-butylperoxy isobutylate, t-butylperoxy acetate, t-butylperoxy-2-ethylhexanoate, t-butylperoxy pivalate, t-butylperoxy octoate, t-butylperoxyisopropyl carbonate, t-butylperoxy benzoate, di-t-butylperoxy phthalate, 2,5-dimethyl-2,5-di(benzoylperoxy)hexane, 2,5-dimethyl-2,5-di(benzoylperoxy)-3-hexyne, and the like; ketone peroxides, such as methyl ethyl ketone peroxide, cyclohexanone peroxide, and the like; lauroyl peroxide; and an azo compound such as azobisisobutyronitrile, azobis(2,4-dimethylvaleronitrile), and the like, but are not limited thereto.

The radical initiator may be included at 0.001 to 5 parts by weight, 0.005 to 3 parts by weight, or 0.01 to 1 parts by weight with respect to 100 parts by weight of the ethylene/α-olefin-based copolymer.

The method of preparing the silane modified ethylene/α-olefin-based copolymer is not particularly limited. For example, a resin composition including an ethylene/α-olefin-based copolymer and a silane compound is added to a reactor, and is graft reacted by heat melting in the presence of a radical initiator to prepare the silane modified ethylene/α-olefin-based copolymer.

As the reactor, any reactor in which a desired copolymer is prepared by heat melting or reacting a liquid phase reactant may be used without particular limitation. The reactor, for example, may be selected from twin-screw extruders, and the silane modified ethylene/α-olefin-based copolymer may be prepared as a master batch in a pellet form through the above-described extruder.

In the embodiment, the silane modified ethylene/α-olefin-based copolymer may include a main chain and a branched chain bound to the main chain including the unit of an olefin-based monomer.

When the above-described ethylene/α-olefin-based copolymer has many side chains, a density is low. The ethylene/α-olefin-based copolymer having less side chains has a high density, and thus it is preferable to use the ethylene/α-olefin-based copolymer having many side chains in consideration of grafting efficiency. When the grafting efficiency of the ethylene/α-olefin-based copolymer is increased, the adhesive strength of the encapsulant may be further improved.

In the embodiment, the branched chain may include a compound represented by the following Formula 3.

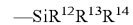  [Formula 3]

In Formula 3, $R^{12}$ and $R^{13}$ are each independently halogen, an amine group, —$R^{15}R^{16}$ or —$R^{16}$, $R^{15}$ is an oxygen (O) or sulfur (S) atom, $R^{16}$ is hydrogen, an alkyl group, an aryl group, an aralkyl group, or an acyl group, $R^{14}$ is —$OSiR^{17}{}_mR^{18}{}_{(2-m)}R^{19}$, $R^{17}$ and $R^{18}$ are each independently halogen, an amine group, —$R^{20}R^{21}$ or —$R^{21}$, $R^{20}$ is an oxygen (O) or sulfur (S) atom, $R^{21}$ is hydrogen, an alkyl group, an aryl group, an aralkyl group, or an acyl group, $R^{19}$ is —$(CH_2)_nNR^{22}R^{23}$, $R^{22}$ and $R^{23}$ are each independently hydrogen or $R^{24}NH_2$ bound to nitrogen atoms, $R^{24}$ is an alkylene group, m is an integer of 1 or 2, and n is an integer of 1 or more.

In Formula 3, preferably, $R^{12}$ and $R^{13}$ independently represent a hydroxy group or —$R^{15}R^{16}$ bound to silicon atoms, $R^{15}$ is oxygen, $R^{16}$ represents an alkyl group. Further, $R^{14}$ is preferably bound to silicon atoms, and represents —$OSiR^{17}{}_mR^{18}{}_{(2-m)}R^{19}$. Here, $R^{17}$ and $R^{18}$ may independently represent a hydroxy group or —$R^{20}R^{21}$ bound to silicon atoms, $R^{20}$ may be oxygen, and $R^{21}$ may be an alkyl group.

Further, $R^{19}$ is preferably bound to silicon atoms, and represents —$(CH_2)nNR^{22}R^{23}$, $R^{22}$ and $R^{23}$ may independently represent hydrogen or $R^{24}NH_2$ bound to nitrogen atoms, $R^{24}$ may be an alkylene group, but the present application is not limited thereto.

Further, more preferably, in Formula 3, $R^{12}$ and $R^{13}$ may be a hydroxy group, $R^{14}$ may be —$OSiR^{17}{}_mR^{18}{}_{(2-m)}R^{19}$ bound to silicon atoms, $R^{17}$ and $R^{18}$ may be a hydroxy group, $R^{19}$ may be —$(CH_2)_nNR^{22}R^{23}$ bound to silicon atoms. Further, more preferably, $R^{22}$ may be hydrogen, $R^{23}$ may be $R^{24}NH_2$, and $R^{24}$ may be an alkylene group, but the present application is not limited thereto.

In the embodiment, the silane modified ethylene/α-olefin-based copolymer may include a main chain and a branched chain bound to the main chain including the polymerization unit of an olefin-based monomer, and the branched chain may include a compound represented by the following Formula 4.

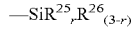

$$—SiR^{25}{}_rR^{26}{}_{(3-r)} \qquad \text{[Formula 4]}$$

In Formula 4, $R^{25}$ and $R^{26}$ are each independently halogen, an amine group, —$R^{27}R^{28}$ or —$R^{28}$, $R^{27}$ is an oxygen (O) or sulfur (S) atom, $R^{28}$ is hydrogen, an alkyl group, an aryl group, an aralkyl group, or an acyl group, and r is an integer in the range of 1 to 3.

In Formula 4, preferably, $R^{25}$ and $R^{26}$ may be independently a hydroxy group or —$R^{27}R^{28}$ bound to silicon atoms, $R^{27}$ may be oxygen, and $R^{28}$ may be an alkyl group, but the present application is not limited thereto.

When the silane modified ethylene/α-olefin-based copolymer includes a main chain and a branched chain, and the branched chain includes a compound including the above-described Formula 3 and/or Formula 4, more excellent physical properties such as adhesive strength, sealing properties, insulating properties, long term durability, formability or the like may be excellently ensured.

A main chain forming the silane modified ethylene/α-olefin-based copolymer is an ethylene/α-olefin-based copolymer, and is the same as described above.

3) Heat Resistant Polymer Resin

An encapsulant according to the embodiment of the present application may include a heat resistant polymer resin in addition to the above-described ethylene/α-olefin-based copolymer and silane modified ethylene/α-olefin-based copolymer.

In the embodiment, the heat resistant polymer resin is a polymer resin having a melting point (Tm) higher than the ethylene/α-olefin-based copolymer.

As the heat resistant polymer resin, any heat resistant polymer resins having a melting point (Tm) higher than the ethylene/α-olefin-based copolymer may be variously used without particular limitation. The heat resistant polymer resin may be suitably selected in consideration of compatibility with an ethylene/α-olefin-based copolymer, a silane modified ethylene/α-olefin-based copolymer, etc., and for example, may be a polyolefin-based resin such as a polyethylene-based resin and/or a polypropylene-based resin, etc.

In the embodiment, the heat resistant polymer resin may include a low density polyethylene (LDPE). In the present specification, the term "low density polyethylene" may denote a thermoplastic ethylene polymer derived from an ethylene monomer and having low crystallinity, which includes more long-chain branches than a high density polyethylene (HDPE) upon a calculation based on about 2% of carbon atoms.

The low density polyethylene may be a polyethylene having a density of 0.960 g/cm³ or less, and more specifically, may be a low density polyethylene having a density in the range of about 0.820 to 0.960 g/cm³.

For example, the heat resistant polymer resin may have a melting point of 60° C. or more. In the present specification, the term "melting point" may denote the same concept as a "melting point" of general meaning, and more specifically, may denote a minimum temperature at which the main chain of the resin may flow.

In another embodiment, the melting point of the heat resistant polymer resin may be 70° C. or more, 80° C. or more, 90° C. or more, or 100° C. or more, but is not limited thereto.

Further, the higher the melting point of the heat resistant polymer resin is, the more excellent the formability thereof and compatibility with the above-described ethylene/α-olefin-based copolymer and/or silane modified ethylene/α-olefin-based copolymer are, and thus the upper limit of the melting point is not particularly limited, but for example, may be about 250° C., 200° C. or 150° C.

In the embodiment, the melting point of the heat resistant polymer resin may be in the range of 100 to 150° C. in consideration of formability and compatibility with other copolymers.

The melt index (MI) of the heat resistant polymer resin may be, for example, in the range of 0.1 g/10 min to 40 g/10 min, 0.1 g/10 min to 35 g/10 min, 0.1 g/10 min to 30 g/10 min or 0.1 g/10 min to 25 g/10 min at a temperature of 190° C. and a load of 2.16 kg, but is not particularly limited to.

When the melt index of the heat resistant polymer resin is adjusted in the above-described range, the encapsulant made from the heat resistant polymer resin may prevent delamination attributable to the low improvement effect of creep properties in the solar cell module, compatibility with the above-described ethylene/α-olefin copolymer or the like may be increased, and when the sheet-type encapsulant is formed, formability may be excellent.

The heat resistant polymer resin, for example, may be included at 0.01 parts by weight or more but less than 3 parts by weight, and more Specifically, in the range of 0.1 to 2.5 parts by weight or 1 to 2 parts by weight with respect to 100 parts by weight of the mixture of an ethylene/α-olefin-based copolymer and a silane modified ethylene/α-olefin-based copolymer.

When a content of the heat resistant polymer resin is adjusted in the above-described, the encapsulant sheet made from the heat resistant polymer resin may improve creep properties and ensure excellent transparency.

4) Additional Components

The encapsulant according to the embodiment of the present application includes the above-described three components, and may further include other resin components or additives selectively.

As the resin components, the resin which is typically used may be suitably selected and included in consideration of the above-described melting point, a melt index, etc.

For example, the additives may include heat stabilizers, light stabilizers (UV stabilizers), UV absorbents, antioxidants, etc.

For example, the heat stabilizer may be one or more types selected from a phosphorus-based stabilizer such as tris(2, 4-di-tert-butylphenyl)phosphite, bis[2,4-bis(1,1-dimethylethyl)-6-methylphenyl]ethyl ester phosphorous acid, tetrakis (2,4-di-tert-butylphenyl)-[1,1-biphenyl]-4,4'-diylbisphosphonate, bis(2,4-di-tert-butylphenyl) pentaerythritoldiphosphite, and the like; and a lactone-based stabilizer such as reaction products of 8-hydroxy-5,7-di-tert-butyl-furan-2-one and o-xylene, etc.

The light stabilizer may prevent photooxidation, and an amine-based compound or a piperidine-based compound may be exemplified therefor, but the light stabilizer is not limited thereto.

For example, the UV absorbents may include a benzophenone-based UV absorber, a benzotriazole-based UV absorber, an acrylonitrile-based UV absorber, a metal complex salt-based UV absorber, an amine-based UV absorber, titanium oxide, zinc oxide, etc.

Further, any antioxidant known in the related field may be used without limitation as the antioxidant, for example, phenolic, amine, quinone, sulfur or phosphorus antioxidants may be exemplified, and a commercial product may be used. For example, the commercial products may include, for example, one type or a mixture of two or more types suitably selected from Irganox 1076 (BASF SE), Irgafos 168 (BASF SE), Irganox 1010 (Ciba Specialty Chemicals), Irganox 1098 (Ciba Specialty Chemicals), Irganox 1330 (Ciba Specialty Chemicals), Irganox 3114 (Ciba Specialty Chemicals), Irganox 3125 (Ciba Specialty Chemicals), Cyanox 1790 (Cytec Industries Inc.), Tinuvin 120 (BASF SE), Tinuvin 326 (BASF SE), Tinuvin 327 (BASF SE), Tinuvin 328 (BASF SE), Irgafos 12 (Ciba Specialty Chemicals), Irgafos 38 (Ciba Specialty Chemicals), Weston 618 (GENERAL ELECTRICS), Weston 619G (GENERAL ELECTRICS) or Ultranox 626 (GENERAL ELECTRICS). The content of the antioxidant may be suitably adjusted according to purposes and types, and for example, the antioxidant may be included in the range of 0.1 to 10 parts by weight with respect to 100 parts by weight of the mixture of the above-described ethylene/α-olefin-based copolymer and silane modified ethylene/α-olefin-based copolymer.

In addition to the above-described additives, various additives known in the related field may be further used suitably. The content of the additives may be suitably adjusted according to purposes and types. The additives, for example, may be included as a mixture in the suitable range of about 0.001 to 10 parts by weight with respect to 100 parts by weight of the mixture of the ethylene/α-olefin-based copolymer and silane modified ethylene/α-olefin-based copolymer, but are not limited thereto.

When the encapsulant according to the embodiment of the present application includes the above-described components, the encapsulant may exhibit excellent creep properties.

In the embodiment, the encapsulant according to the embodiment of the present application may satisfy the following Expression 1.

$$\Delta X \leq 3 \text{ mm} \quad \quad \text{[Expression 1]}$$

In Expression 1, after two layers of encapsulants having a size of 20 cm×25 cm (width×length) are overlapped between a first glass plate having a thickness of 3.2 and having a size of 20 cm×30 cm (width×length) and a second glass plate having a thickness of 3.2 and having a size of 20 cm×30 cm (width×length), and laminated to prepare a sample having a size of 20 cm×35 cm (width×length), the sample is vertically (90°) erected, the first glass plate is suspended, the sample is maintained at 100° C. for 10 hours, and here, an average value of vertically creeping distances of a left side, a center, and a right side of the second glass plate is represented by ΔX.

Expression 1 will be described in detail with reference to FIG. 2.

Referring to FIG. 2, the first glass plate G1 having a thickness of 3.2 mm the width of 20 cm, and the length of 30 cm; and the second glass plate G2 having a thickness of 3.2 mm, the width of 20 cm, and the length of 30 cm are prepared. Here, low iron tempered glass plates are preferably used as the glass plates G1 and G2, and the first glass plate G1 and the second glass plate G2 each may have weights in the range of about 465 to 480 g.

Next, two layers of the encapsulant S are overlapped and interposed between the first glass plate G1 and the second glass plate G2, and laminated in a vacuum laminator at a temperature of about 150° C. to prepare a sample with a size of 20 cm×35 cm (width×length). Here, the encapsulant S is cut to have a size of 20 cm×25 cm (width×length) for use, but the thickness of the encapsulant S is not limited. Further, when the glass plates G1 and G2 are disposed on the both sides of the encapsulant S, as illustrated in FIG. 2, the first glass plate G1 and the second glass plate G2 are preferably disposed to extend above and below the encapsulant S, respectively, and alternated with gaps of about 5 cm.

Next, the sample is erected to be perpendicular (90°) to the ground, and the first glass plate G1 is fixedly suspended through a clamp, etc. Then, after the sample is vertically held in a chamber at 100° C. for about 10 hours, a distance in which the second glass plate G2 creeps in a vertical direction, that is, a distance in which the second glass plate G2 slides down from a base line shown in FIG. 2 is measured at each of left side, center and right side of the second glass plate G2, and thereby an average value (ΔX) thereof may be calculated.

When an average value (ΔX) measured using a method according the exemplary embodiment is 3 mm or less, excellent creep physical properties may be ensured. In another embodiment, the creeping distance (ΔX) according to the embodiment of the present application may be 2.75 mm or less or 2.5 mm or less.

When the encapsulant according to the embodiment of the present application is adjusted to satisfy Expression 1, excellent creep physical properties may be ensured, and thus delamination is not generated and modification is decreased even when the encapsulant is used under conditions of a high temperature and/or high humidity for a long time. Accordingly, when the encapsulant is applied to a PV module, the PV module may exhibit excellent durability, etc.

Further, the present application relates to a method of manufacturing the encapsulant.

As an exemplary method of manufacturing the encapsulant, any method including an operation of preparing a sheet-type encapsulant using a resin composition including the above-described components may be used without limitation.

More specifically, the method of manufacturing the encapsulant includes an operation of preparing a sheet-type encapsulant using a resin composition including the ethylene/α-olefin copolymer, the silane modified ethylene/α-olefin copolymer, and the heat resistant polymer resin.

The encapsulant may be shaped in a sheet form using an extruder, for example, such as a T-die extruder. Further, each component may be added into the extruder, or may be put in the form of a master batch, and it is preferable to add the components in the form of a master batch.

The thickness of the encapsulant prepared through an extrusion process may be, for example, in the range of 10 to 5000 μm, 50 to 2000 μm or 100 to 1500 μm, but is not limited thereto.

The present application also relates to a PV module.

As an exemplary PV module, any PV module including the above-described encapsulant may be used without particular limitation.

The PV module according to the embodiment of the present application includes the encapsulant and an optical device encapsulated by the encapsulant. The optical device, for example, may be suitably selected from photovoltaic cell devices such as a solar cell, or the like; light emission devices such as a light emitting diode, an organic light emitting diode, or the like; and light sensors which senses light, or the like. The PV module according to the embodiment of the present application may be, for example, a solar cell module.

FIG. 3 is a view exemplarily illustrating the PV module according to the embodiment of the present application.

As shown in FIG. 3, the exemplary PV module according to the embodiment of the present application includes a front substrate 210, an encapsulant layer 220, a solar cell C and a back sheet 100.

The front substrate is preferably a substrate which protects the front side (corresponding to an upper side in the drawings) of the solar cell and provides a light receiving surface. Preferably, the front substrate has excellent light transmittance. As the front substrate, for example, it is preferable to use a hard substrate such as tempered glass, a transparent plastic plate, or the like as a transparent substrate having advantageous to incident light.

The encapsulant layer is a layer encapsulating (packing and/or fixing) a solar cell, which may include a front encapsulant layer 221 and a back encapsulant layer 222. Here, as shown in FIG. 3, the solar cell may be packed and/or fixed between the front encapsulant layer and the back encapsulant layer. At least one of the front encapsulant layer 221 and the back encapsulant layer 222 may be configured as the encapsulant according to the embodiment of the present application.

As shown in FIG. 3, the solar cell may be arranged in a plurality in the encapsulant layer. That is, the solar cell may be packed and/or fixed while being arranged in a plurality between the front encapsulant layer 221 and the back encapsulant layer 222. Further, the solar cells are electrically connected to each other.

The solar cell may be, for example, a crystalline solar cell, a thin-film type solar cell, or the like, but is not particularly limited thereto. Further, the solar cell may include a front electrode solar cell, a back electrode solar cell and a combination thereof.

The back sheet is attached under the back encapsulant layer. The back sheet may be attached under the back encapsulant layer by thermal lamination (thermal welding), adhesives, etc. The adhesive may be, for example, one or more types selected from an acrylic adhesive, an urethane adhesive, an epoxy adhesive, and a polyolefin adhesive, or the like, but is not particularly limited thereto.

Conditions to perform the thermal lamination of the back sheet and the back encapsulant layer are not particularly limited, and for example, thermal lamination may be performed at a temperature in the range of 90 to 230° C. or 110 to 200° C. for 1 to 30 minutes or 1 to 10 minutes.

The PV module according to the embodiment of the present application may be prepared by sequentially stacking a front substrate, a front encapsulant layer, a plurality of solar cells electrically connected to each other, a back encapsulant layer, and a back sheet, and adhering them using a method of performing thermal lamination thereon while vacuum absorbing them integrally.

The back sheet may include a base 10 and surface layers 20 and 30 formed on at least one side of the base 10. The back sheet may have various colors such as a transparent color, a white color, a black color, etc. The color, for example, may be suitably implemented according to the types and contents of color dyes included in the surface layers 20 and 30.

The surface layers 20 and 30 may number one or more. FIG. 3 shows an exemplary embodiment of the present application, exemplifying the surface layers 20 and 30 formed on the both sides of the base 10.

The back sheet may further include one or more functional layers in addition to the base and the surface layers, and various materials known in the related field may be used as the base and the surface layers.

Advantageous Effects

An encapsulant according to an embodiment of the present application has excellent heat resistance or the like and improved creep properties, and thus even when the encapsulant is used under conditions of high temperature and/or high humidity for a long time, deformation is small and the encapsulant can exhibit excellent adhesive strength. Accordingly, when the encapsulant is applied to a PV module, durability or the like may be improved.

DESCRIPTION OF DRAWINGS

FIG. 1 is a cross sectional view of a solar cell module, as a conventional PV module.

FIG. 2 is a view for describing a method of measuring creep physical properties for the encapsulant according to an embodiment of the present application as an example.

FIG. 3 is a view exemplarily illustrating the structure of a PV module according to an embodiment of the present application.

FIG. 4 shows pictures illustrating an evaluation result of encapsulant samples according to Example 1 and Comparative Example 1 of the present application.

MODES OF THE INVENTION

Hereinafter, the present application will be described in detail in conjunction with examples according to the present application and comparative examples not according to the present application, but the scope of the present application is not limited the following examples.

Physical properties in the examples and the comparative examples were evaluated according to the following method as below.

1. Measurement and Evaluation of Creep Physical Properties

1) Glass plate and encapsulant sheet: two low iron tempered glass plates (weight: 475 g) having a thickness of 3.2 mm, and a size of 20 cm×30 cm (width×length) were prepared. Further, encapsulant sheets (thickness: about 500 μm) according to each of the examples and comparative examples were cut to a size of 20 cm×25 cm (width×length).

2) Thermal lamination: two encapsulant sheets were stacked between two glass plates in the sequence of a first glass plate (lower plate), (two) encapsulants, and a second glass plate (upper plate). The first glass plate and the second glass plate were stacked to extend above and below the two encapsulants, respectively, with gaps of about 5 cm (refer to FIG. 2). Then, a thermal lamination was performed in a vacuum laminator at a temperature of 150° C. for 17 minutes (vacuuming for 6 minutes→compressing for 1 minute→maintaining for 10 minutes), and thereby a sample having a size of 20 cm×35 cm (width×length) was prepared.

3) Measurement of creeping distance: the sample was vertically erected in a chamber, the first glass plate was suspended through a clamp, the sample was stored vertically held in the chamber maintaining the temperature of 100° C. and the humidity of 60% for 10 hours (refer to FIG. 2), each creeping distance (sliding distance) of the left side, center, and right side of the second glass plate from a base line each was measured, the average value (ΔX) thereof was calculated and evaluated according to the following standard, and then was shown in Table 1.

<Evaluation Standard>

O: when the average value (ΔX) of the creeping distances measured at each of the left side, center, and right side was 3 mm or less.

X: when the average value (ΔX) of the creeping distances measured at each of the left side, center, and right side was more than 3 mm.

Example 1

<Preparation of Silane Modified Ethylene/α-Olefin Copolymer>

After vinyltrimethoxy silane (VTMS) and Luperox®101 (2,5-bis(tert-butylperoxy)-2,5-dimethylhexane) were mixed in the weight ratio of 50:1, the mixture was included in the ethylene/1-octene copolymer (LC670; LG Chem.) having a density of 0.870 g/cm³ and a melt index (MI) of 5 g/10 min at a temperature of 190° C. and a load of 2.16 kg at 5 parts by weight with respect to 100 parts by weight of the ethylene/1-octene copolymer, was put into a twin-screw extruder together with the ethylene/1-octene copolymer, was extruded (heated, melted and stirred) at a temperature of 220° C. to perform a grafting reaction, and thereby the master batch of a silane modified ethylene/α-olefin copolymer (hereinafter, referred to as "Si M/B") was prepared.

<Preparation of Encapsulant Sheet>

A certain amount of a UV absorbent, a UV stabilizer and an antioxidant was mixed with the ethylene/1-octene copolymer (LC670; LG Chem., hereinafter, referred to as a "base resin") having a density of 0.870 g/cm³, a melting point (Tm) of 58° C., and a melt index (MI) of 5 g/10 min at a temperature of 190° C. and a load of 2.16 kg, and then extruded to prepare a UV master batch (hereinafter, referred to as a "UV M/B").

Thereafter, a base resin, Si M/B and UV M/B prepared as above, and a low density polyethylene (BC500; LG Chem., hereinafter, referred to as a "LDPE") having a melting point (Tm) of about 105° C. and a melt index (MI) of 3 g/10 min at a temperature of 190° C. and a load of 2.16 kg as a heat resistant polymer resin were mixed in the weight ratio of 65:35:3:2, and thereby a mixture was prepared.

The mixture was introduced into the hopper of an extruding machine having a twin-screw extruder (φ19 mm) and a T die (width: 200 mm), extruded at a temperature of 180° C. and the extracting speed of 3 m/min, and thereby an encapsulant sheet having a thickness of about 500 μm was prepared.

Example 2

The encapsulant sheet was prepared in the same manner as in Example 1 except that the LDPE was included at 1 part by weight with respect to 100 parts by weight of the mixture of the base resin and Si M/B.

Example 3

The encapsulant sheet was prepared in the same manner as in Example 1 except that the LDPE was included at 3 parts by weight with respect to 100 parts by weight of the mixture of the base resin and Si M/B.

Example 4

The encapsulant sheet was prepared in the same manner as in Example 1 except that the LDPE was included at 5 parts by weight with respect to 100 parts by weight of the mixture of the base resin and Si M/B.

Example 5

The encapsulant sheet was prepared in the same manner as in Example 1 except that a LDPE (BF0300; LG Chem.) having a melting point (Tm) of about 105° C., the melt index (MI) of 0.3 g/10 min at 190° C. and a load of 2.16 kg was included as a heat resistant polymer resin.

Example 6

The encapsulant sheet was prepared in the same manner as in Example 1 except that a LDPE (LB8500; LG Chem.) having a melting point (Tm) of about 105° C., a melt index (MI) of 8.5 g/10 min at 190° C. and a load of 2.16 kg was included as a heat resistant polymer resin.

Example 7

The encapsulant sheet was prepared in the same manner as in Example 1 except that a LDPE (MB9205; LG Chem.) having a melting point (Tm) of about 105° C., a melt index (MI) of 24 g/10 min at 190° C. and a load of 2.16 kg was included as a heat resistant polymer resin.

Comparative Example 1

The encapsulant sheet was prepared in the same manner as in Example 1 except that the LDPE was not introduced into the hopper of the extruding machine, and a mixture in which the base resin, Si M/B and UV M/B were mixed in the weight ratio of 63.1:34:2.9 was used.

Comparative Example 2

The encapsulant sheet was prepared in the same manner as in Example 1 except that a LDPE (MB9500; LG Chem.) having a melting point (Tm) of about 105° C., a melt index (MI) of 50 g/10 min at 190° C. and a load of 2.16 kg was included as a heat resistant polymer resin.

The anti-creep properties of each of the encapsulant sheets according to Examples 1 to 4 and Comparative Example 1 were shown in the following Table 1.

TABLE 1

| Classification | Example 1 | Example 2 | Example 3 | Example 4 | Comparative Example 1 |
|---|---|---|---|---|---|
| Left | 0 | 1.5 | 0 | 0 | 4.0 |
| Center | 0 | 1.5 | 0 | 0 | 4.0 |

TABLE 1-continued

| Classification | Example | | | | Comparative Example |
| --- | --- | --- | --- | --- | --- |
| | 1 | 2 | 3 | 4 | 1 |
| Right | 0 | 1.5 | 0 | 0 | 3.5 |
| Average values | 0 | 1.5 | 0 | 0 | 3.8 |
| Creep evaluation | ○ | ○ | ○ | ○ | x |

Unit: mm

Further, FIG. 4 shows the pictures of the encapsulant sheets according to Example 1 and Comparative Example 1 right after the test for anti-creep properties.

As shown in Table 1 and FIG. 4, when the heat resistant polymer resin (LDPE) was included, creep properties were improved, the creeping distance was minimal or there was no creeping, and thus the encapsulant sheet could be determined to be useful for an encapsulant.

Further, creep properties of encapsulant sheets according to Examples 5 to 7 and Comparative Example 2 were shown in the following Table 2.

TABLE 2

| Classification | Example | | | Comparative Example |
| --- | --- | --- | --- | --- |
| | 5 | 6 | 7 | 2 |
| Left | 0 | 0.8 | 2.5 | 4.0 |
| Center | 0 | 0.8 | 2.5 | 4.0 |
| Right | 0 | 0.8 | 2.5 | 4.0 |
| Average values | 0 | 0.8 | 2.5 | 4.0 |
| Creep evaluation | ○ | ○ | ○ | x |

Unit: mm

As shown in Table 2, it was determined that creep physical properties could differ according to the melt index (MI) of a LDPE, and when the melt index (MI) was about 40 g/10 min or less, creep physical properties were excellent enough for the encapsulant sheet to be applied to the encapsulant.

DESCRIPTION OF NUMERAL 1, 100: BACK SHEET
2a, 221: FRONT ENCAPSULANT LAYER
2B, 222: BACK ENCAPSULANT LAYER
3: TEMPERED GLASS
10: BASE
20, 30: SURFACE LAYER
210: FRONT SUBSTRATE
220: ENCAPSULANT LAYER
C: SOLAR CELL

The invention claimed is:

1. An encapsulant for a photovoltaic (PV) module, comprising:
an ethylene/α-olefin-based copolymer;
a silane modified ethylene/α-olefin-based copolymer; and
a heat resistant polymer resin having a melting point (Tm) higher than the ethylene/α-olefin-based polymer,
wherein the silane modified ethylene/α-olefin-based copolymer is the ethylene/α-olefin-based copolymer graft polymerized with a silane compound, and
wherein the silane compound comprises a compound represented by Formula 1:

$$DSiR^1_p R^2_{(3-p)} \quad \text{[Formula 1]}$$

wherein D is an alkenyl group, $R^1$ is an alkoxy group, an alkylthio group, an aryloxy group, an acyloxy group, a hydroxy group, a halogen group, an amine group or $-R^3R^4$, $R^3$ is an oxygen (O) or sulfur (S) atom, $R^4$ is an alkyl group, an aryl group, or an acyl group, $R^2$ is hydrogen, an alkyl group, an aryl group, or an aralkyl group, and p is an integer in a range of 1 to 3.

2. The encapsulant of claim 1, wherein the heat resistant polymer resin has a melting point (Tm) of 100° C. or more.

3. The encapsulant of claim 1, wherein the heat resistant polymer resin has a melting point (Tm) in a range of 100 to 150° C.

4. The encapsulant of claim 1, wherein the heat resistant polymer resin has a melt index (MI) lower than the ethylene/α-olefin-based copolymer.

5. The encapsulant of claim 1, wherein the heat resistant polymer resin has a melt index (MI) in a range of 0.1 g/10 min to 40 g/10 min at a temperature of 190° C. and a load of 2.16 kg.

6. The encapsulant of claim 1, wherein the heat resistant polymer resin is included in a range of 0.1 to 10 parts by weight with respect to 100 parts by weight of a mixture of the ethylene/α-olefin-based copolymer and the silane modified ethylene/α-olefin-based copolymer.

7. The encapsulant of claim 1, wherein the heat resistant polymer resin is included in a range of 1 to 5 parts by weight with respect to 100 parts by weight of a mixture of the ethylene/α-olefin-based copolymer and the silane modified ethylene/α-olefin-based copolymer.

8. The encapsulant of claim 1, wherein the heat resistant polymer resin is a polyethylene-based resin and/or a polypropylene-based resin.

9. The encapsulant of claim 1, wherein the heat resistant polymer resin comprises a low density polyethylene.

10. The encapsulant of claim 1, satisfying the following Expression 1:

$$\Delta X \leq 3 \text{ mm} \quad \text{[Expression 1]}$$

in the Expression 1, after two layers of encapsulants having a size of 20 cm×25 cm (width×length) are overlapped and interposed between a first glass plate having a thickness of 3.2 and having a size of 20 cm×30 cm (width×length) and a second glass plate having a thickness of 3.2 and having a size of 20 cm×30 cm (width×length) and laminated to prepare a sample having a size of 20 cm×35 cm (width×length), the sample was vertically (90°) erected, the first glass plate was fixedly suspended, the sample was maintained at 100° C. for 10 hours, and here, an average value of vertically creeping distances of a left side, a center, and a right side of the second glass plate is represented by $\Delta X$.

11. An encapsulant for a photovoltaic (PV) module, comprising:
an ethylene/α-olefin-based copolymer;
a silane modified ethylene/α-olefin-based copolymer; and
a heat resistant polymer resin having a melting point (Tm) higher than the ethylene/α-olefin-based polymer,
wherein the silane modified ethylene/α-olefin-based copolymer is the ethylene/α-olefin-based copolymer graft polymerized with a silane compound, and
wherein the silane compound comprises a compound represented by Formula 2:

$$SiR^5_q R^6_{(4-q)} \quad \text{[Formula 2]}$$

wherein $R^5$ is $-(CH_2)_v NR^7 R^8$, $R^7$ and $R^8$ are each independently hydrogen or $R^9 NH_2$ bound to nitrogen atoms, $R^9$ is an alkylene group having 1 to 6 carbon atoms, $R^6$ is halogen, an amine group, $-R^{10}R^{11}$ or —$R^{11}$, $R^{10}$ is an oxygen (O) or sulfur (S) atom, $R^{11}$ is hydrogen, an alkyl group, an aryl group, an aralkyl group, or an acyl group, v is an integer of 1 or more, and q is an integer in a range of 1 to 4.

12. An encapsulant for a photovoltaic (PV) module, comprising:

an ethylene/α-olefin-based copolymer;
a silane modified ethylene/α-olefin-based copolymer; and
a heat resistant polymer resin having a melting point (Tm) higher than the ethylene/α-olefin-based polymer,
wherein the silane modified ethylene/α-olefin-based copolymer comprises a main chain including a polymerization unit of an olefin-based monomer and a branched chain bound to the main chain, and the branched chain includes a compound represented by Formula 3 or Formula 4:

—$SiR^{12}R^{13}R^{14}$      [Formula 3]

wherein, in Formula 3, $R^{12}$ and $R^{13}$ are each independently halogen, an amine group, —$R^{15}R^{16}$ or —$R^{16}$, $R^{15}$ is an oxygen (O) or sulfur (S) atom, $R^{16}$ is hydrogen, an alkyl group, an aryl group, an aralkyl group, or an acyl group, $R^{14}$ is —$OSiR^{17}_mR^{18}_{(2-m)}R^{19}$, $R^{17}$ and $R^{18}$ are each independently halogen, an amine group, —$R^{20}R^{21}$ or —$R^{21}$, $R^{20}$ is an oxygen (O) or sulfur (S) atom, $R^{21}$ is hydrogen, an alkyl group, an aryl group, an aralkyl group, or an acyl group, $R^{19}$ is —$(CH_2)_n$NR^{22}R^{23}$, $R^{22}$ and $R^{23}$ are each independently hydrogen bound to nitrogen atoms or $R^{24}NH_2$, $R^{24}$ is an alkylene group, m is an integer of 1 or 2, and n is an integer of 1 or more, —$SiR^{25}_rR^{26}_{(3-r)}$      [Formula 4]

wherein, in Formula 4, $R^{25}$ and $R^{26}$ are each independently halogen, an amine group, —$R^{27}R^{28}$ or —$R^{28}$, $R^{27}$ is an oxygen (O) or sulfur (S) atom, $R^{28}$ is hydrogen, an alkyl group, an aryl group, an aralkyl group, or an acyl group, and r is an integer in a range of 1 to 3.

13. A method of manufacturing the encapsulant for a photovoltaic (PV) module of claim 1, comprising manufacturing a sheet-shaped resin composition which includes the ethylene/α-olefin-based copolymer, the silane modified ethylene/α-olefin-based copolymer and the heat resistant polymer resin having a melting point higher than the ethylene/α-olefin-based polymer.

14. A PV module comprising an encapsulant layer including the encapsulant according to claim 1.

15. The PV module of claim 14, comprising:
a front substrate;
the encapsulant layer formed on the front substrate;
a solar cell encapsulated by the encapsulant layer; and
a back sheet formed on the encapsulant layer.

* * * * *